United States Patent
Chang

(10) Patent No.: US 9,484,386 B2
(45) Date of Patent: Nov. 1, 2016

(54) DIFFRACTION GRATING WITH MULTIPLE PERIODIC WIDTHS

(71) Applicant: Taiwan Semiconductor Manufacturing Company, Ltd., Hsin-Chu (TW)

(72) Inventor: Hsin-Chieh Chang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 14/092,592

(22) Filed: Nov. 27, 2013

(65) Prior Publication Data

US 2015/0145084 A1 May 28, 2015

(51) Int. Cl.
*G02B 26/00* (2006.01)
*H01L 27/146* (2006.01)
*G02B 5/18* (2006.01)
*G02B 5/20* (2006.01)

(52) U.S. Cl.
CPC ....... *H01L 27/14685* (2013.01); *G02B 5/1819* (2013.01); *G02B 5/203* (2013.01); *H01L 27/14621* (2013.01); *G02B 2005/1804* (2013.01)

(58) Field of Classification Search
CPC .................................. H01L 31/02164
See application file for complete search history.

(56) References Cited

U.S. PATENT DOCUMENTS

2012/0091372 A1\* 4/2012 Molnar et al. ................ 250/550

\* cited by examiner

*Primary Examiner* — Robert Carpenter
(74) *Attorney, Agent, or Firm* — Slater Matsil, LLP

(57) ABSTRACT

An integrated circuit includes a substrate, a plurality of photo detectors formed in the substrate, and a diffraction grating having multiple sections disposed over the plurality of photo detectors. Each section of the diffraction grating has a respective periodic width for a respective target wavelength. The diffraction grating has at least two different target wavelengths. The diffraction grating is interlaced with filters. The filters in each section of the diffraction grating are configured to pass a respective electromagnetic wave with the respective target wavelength.

20 Claims, 3 Drawing Sheets

DIFFRACTION GRATING WITH MULTIPLE PERIODIC WIDTHS

TECHNICAL FIELD

The present disclosure relates generally to an integrated circuit and more particularly a diffraction grating.

BACKGROUND

A diffraction grating can be formed in an integrated circuit with a periodic width. For applications such as angle sensitive pixels (ASP), an image of an incident plane wave is repeated at a Talbot length ($Z_T$) and sensors located at the $Z_T$ can be used to detect the image. A diffraction grating that can produce a better image is desirable.

BRIEF DESCRIPTION OF THE DRAWINGS

Reference is now made to the following descriptions taken in conjunction with the accompanying drawings, in which.

DETAILED DESCRIPTION

Figure 1:
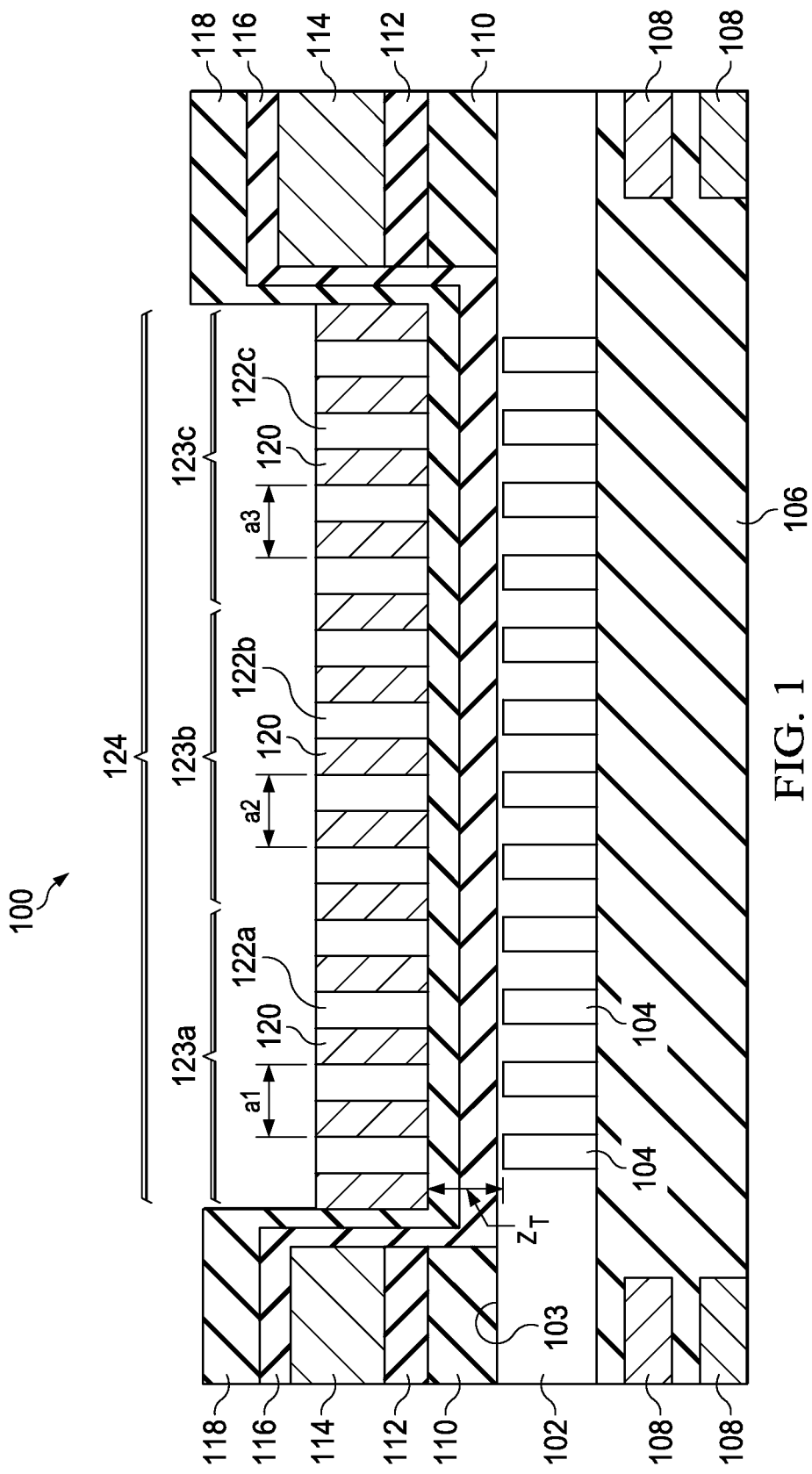
FIG. 1 is a cross section diagram of an exemplary integrated circuit including a diffraction grating according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary integrated circuit 100 including a diffraction grating 124 according to some embodiments. The integrated circuit 100 includes a substrate 102, photo detectors 104, dielectric layers 106, 110, 112, 116, and 118, metal layers 108 and 114, and a diffraction grating 124.

The substrate 102 comprises silicon, silicon dioxide, aluminum oxide, sapphire, germanium, gallium arsenide (GaAs), an alloy of silicon and germanium, indium phosphide (InP), silicon on insulator (SOI), or any other suitable material. The substrate 102 may further include additional features or layers to form various devices and functional features.

The dielectric layer 106 and the metal layers 108 are formed on the front side of the substrate 102 in some embodiments, while dielectric layers 110, 112, 116, and 118, and the metal layer 114 are formed on the back side 103 of the substrate 102 in some embodiments. The dielectric layers 106, 110, 112, 116, and 118 comprise $SiO_2$, SiN, low-k dielectric, or any other suitable material and can be formed by chemical vapor deposition (CVD) or other appropriate deposition process, in some embodiments.

In some embodiments, the dielectric layer 110 and 116 comprise $SiO_2$ as buffer or protection films and the dielectric layers 112 and 118 comprise SiN as protection film. The metal layers 108 and 114 comprise Cu, Al, AlCu, or any other suitable material for electrical connections or pads, and can be formed by physical vapor deposition (PVD), electrochemical plating, or any other suitable process.

The diffraction grating 124 includes multiple sections 123a, 123b, and 123c over the photo detectors 104. Each section 123a, 123b, and 123c of the diffraction grating 124 has a respective periodic width a1, a2, and a3 for a respective target wavelength λ1, λ2, and λ3.

Even though three sections 123a, 123b, and 123c are shown along the cross section in FIG. 1 with three different target wavelengths λ1, λ2, and λ3, there can be different numbers of sections and different numbers of target wavelengths. For example, the diffraction grating 124 can have two different target wavelengths, or four or more target wavelengths.

Also, the diffraction grating 124 can have different sections with the same target wavelengths. For example, the diffraction grating 124 can have 6 sections along one direction with 3 target wavelengths, where the target wavelength of each section is λ1, λ2, λ3, λ1, λ2, and λ3, arranged in that order or any other order. The section width of different sections 123a, 123b, and 123c may be the same or different from each other in various applications.

The diffraction grating 124 has each grating line 120 comprising metal (e.g., Cu or AlCu), SiN, or $SiO_2$ that is interlaced with filters 122a, 122b, and 122c in a respective section of 123a, 123b, and 123c. The filters 122a, 122b, and 122c in each section are configured to pass a respective electromagnetic wave with the respective target wavelength of λ1, λ2, and λ3 (such as blue, green, and red light).

The filters 122a, 122b, and 122c comprise any suitable material. In an example, the filters 122a, 122b, and 122c include a dye-based (or pigment-based) polymer or photoresist for filtering out and passing electromagnetic waves with a specific wavelength (or frequency band). Alternatively, the filters 122a, 122b, and 122c could include a resin or other organic-based material having color pigments. For example, the filters 122a, 122b, and 122c comprise photoresist or polymer with dye or pigments, to pass a visible light such as red, green, and blue for an RGB pixel.

The periodic width a1, a2, and a3 can be determined from the following equation in some embodiments:

$$Z_T = \frac{2a^2}{\lambda},\qquad \text{Eq. (1)}$$

where α is the periodic width, λ is the respective target wavelength, and $Z_T$ is the Talbot length.

If the target wavelength is comparable to the periodic width, then periodic width a1, a2, and a3 can be determined from the following equation in some other embodiments:

$$Z_T = \frac{\lambda}{1-\sqrt{1-\frac{\lambda^2}{a^2}}},\qquad \text{Eq. (2)}$$

where α is the periodic width, λ is the respective target wavelength, and $Z_T$ is the Talbot length.

For example, with a fixed Talbot length at 300 nm, the periodic width can be 262 nm for a blue light at wavelength 460 nm, 284 nm for a green light at wavelength 540 nm, and 302 nm for a red light at wavelength 610 nm. By modifying the periodic width of the diffraction grating 124, the light image from the diffraction grating 124 can be detected by the photo detectors 104 at the same distance $Z_T$ for electromagnetic waves (e.g. visible light) having different wavelengths with better quantum efficiency. In some embodiments, the period width of the diffraction grating 124 can be 0.2 μm-0.9 μm for blue light, 0.3 μm-0.95 μm for green light, and 0.32 μm-1 μm for red light. The width definition ratio between the filter (122a, 122b, or 122c) and the grating line 120 can be 0.35:0.65-0.65:0.35 in some embodiments.

Figure 2:
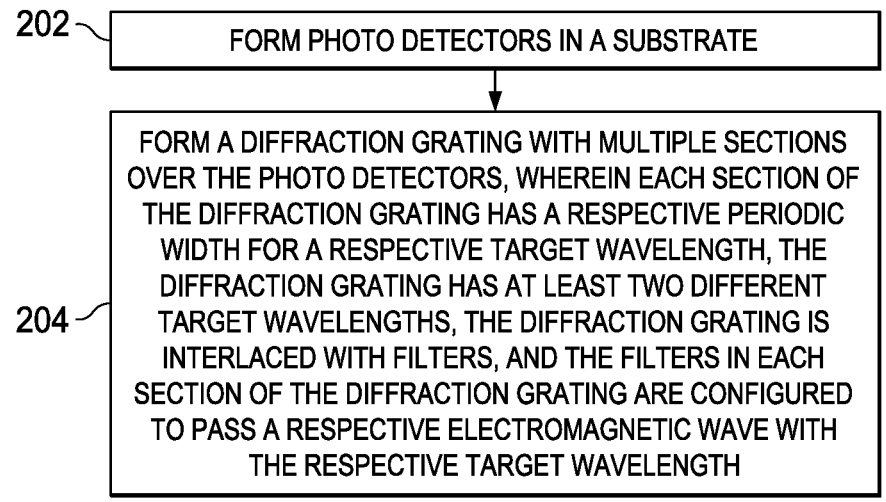
FIG. 2 is a flowchart of the fabrication method of the exemplary integrated circuit including in FIG. 1 according to some embodiments.

FIG. 2 is a flowchart of a fabrication method of the exemplary integrated circuit 100 in FIG. 1 according to some embodiments. At step 202, photo detectors 104 are formed in the substrate 102. Photo detectors 104 can be photo diodes such as PN junction diodes or PIN diodes, and can be formed by depositing P-type and N-type dopants using ion implantation, for example. The periodic width of the photo detectors 104 can be different from the periodic width of the diffraction grating 124 in some embodiments. In other embodiments, the periodic width of the photo detectors 104 can be the same or similar to the periodic width of the diffraction grating 124.

Afterwards, the substrate 102 can be thinned down on the backside 103 to about 2 μm by a chemical mechanical polishing (CMP). Dielectric layers 110 (e.g., SiO$_2$) and 112 (e.g., SiN) can be deposited by CVD with the thickness ranging 0.3 μm-0.5 μm and 0.1 μm-0.3 μm respectively in some embodiments. The metal layer 114 (e.g., AlCu) can be deposited by a PVD with the thickness ranging 0.4 μm-1 μm.

Then the dielectric layers 110 and 112, and the metal layer 114 can be etched out for the diffraction grating 124 (also called a pixel area in some applications). Before forming the diffraction grating 124, dielectric layers 116 (e.g., SiO$_2$) and 118 (e.g., SiN) can be deposited by CVD with a thickness ranging 0.2 μm-0.5 μm and 0.1 μm-0.2 μm respectively in some embodiments.

At step 204, the diffraction grating 124 is formed with multiple sections 123a, 123b, and 123c over the photo detectors 104. For the grating lines 120, a metal layer (e.g., Cu or AlCu) can be deposited by PVD or a dielectric layer (e.g., SiO$_2$) can be deposited by CVD with a thickness ranging 0.3 μm-0.8 and the grating line 120 pattern can be etched out by photolithography.

Afterwards, filter material can be filled in for the filters 122a, 122b, and 122c by coating, for example. The filters 122a, 122b, and 122c are interlaced with the grating lines 120 of the diffraction grating 124. The filters 122a, 122b, and 122c can comprise any suitable material. In an example, the filters 122a, 122b, and 122c include a dye-based (or pigment-based) polymer or photoresist for filtering out and passing electromagnetic wave with a specific wavelength (or frequency band). Alternatively, the filters 122a, 122b, and 122c could include a resin or other organic-based material having color pigments. For example, the filters 122a, 122b, and 122c comprise photoresist or polymer with dye or pigments, to pass a visible light such as red, green, and blue for an RGB pixel.

Each section 123a, 123b, and 123c of the diffraction grating 124 has a respective periodic width a1, a2, and a3, for a respective target wavelength λ1, λ2, and λ3. The filters 122a, 122b, and 122c in each section of the diffraction grating 124 are configured to pass a respective electromagnetic wave with the respective target wavelength. The definition ratio between the filter (122a, 122b, or 122c) and the grating line 120 can be 0.35:0.65-0.65:0.35 in some embodiments.

There can be different numbers of sections and different numbers of target wavelengths. For example, the diffraction grating 124 can have two different target wavelengths, or four or more target wavelengths. The section width of 123a, 123b, and 123c may be the same or different in various applications.

Figure 3:
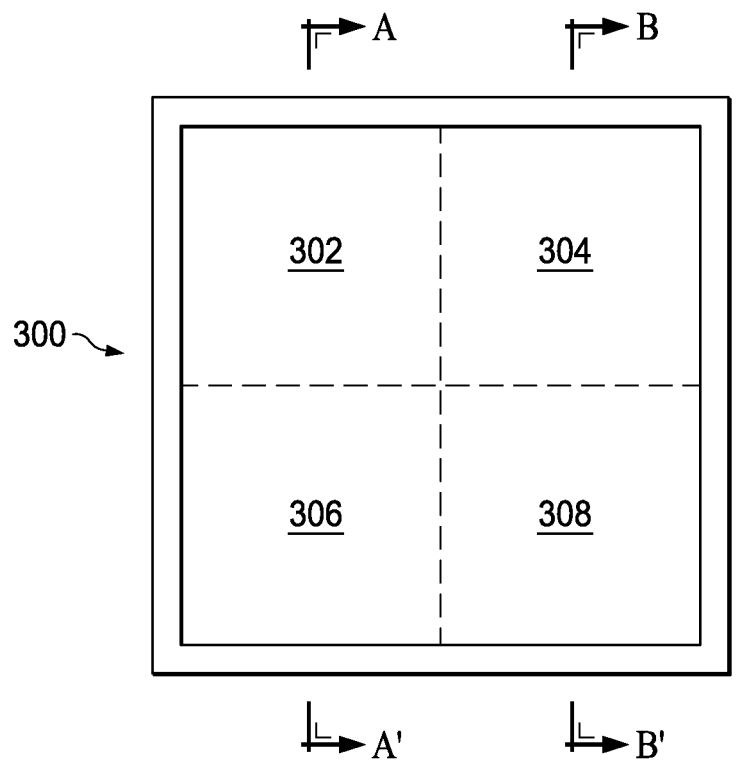
FIG. 3 is a schematic diagram of an exemplary integrated circuit having multiple divisions that include diffraction gratings in FIG. 1 according to some embodiments.

FIG. 3 is a schematic diagram of an exemplary integrated circuit 300 having multiple divisions 302, 304, 306, and 308 that include diffraction gratings such as 124 in FIG. 1 according to some embodiments. The cross section of the integrated circuit 300 along cut lines A-A' and B-B' can be similar to FIG. 1. In some embodiments, the diffraction grating 124 can have 6 sections along the cut lines A-A' and B-B', 3 sections in each division of 302, 304, 306, and 308 with 3 target wavelengths.

For example, the target wavelength of each section can be arranged in the order of λ1, λ2, λ3, λ1, λ2, and λ3, or any other order along the cut lines A-A' and B-B'. Each division of 302, 304, 306, and 308 can have a different phase between the photo detectors 104 and filters 122 (or grating lines 120) as shown in FIGS. 3A-3D.

Figure 3A:
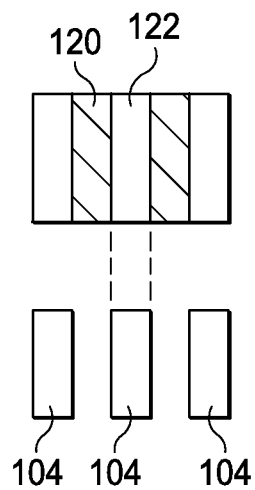
FIGS. 3A-3D are partial cross section diagrams of the exemplary integrated circuit in FIG. 3 having different phase between photo detectors and the diffraction grating according to some embodiments.
Figure 3B:
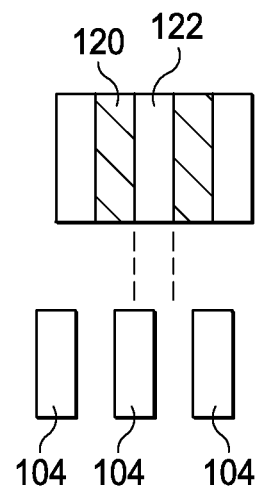
Figure 3C:
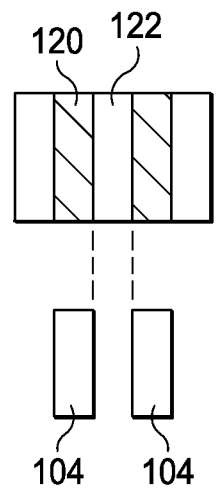
Figure 3D:
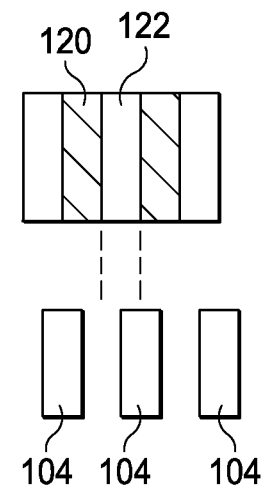

FIGS. 3A-3D are partial cross section diagrams of the exemplary integrated circuit 300 in FIG. 3 having different phase between photo detectors and the diffraction grating according to some embodiments. In FIG. 3A, the photo detectors 104 are aligned with the filters 122 of the diffraction grating 124 with a phase difference of 0 degrees. In FIG. 3B, the photo detectors 104 are aligned with the filters 122 of the diffraction grating 124 with a phase difference of 90 degrees. In FIG. 3C, the photo detectors 104 are aligned with the filters 122 of the diffraction grating 124 with a phase difference of 180 degrees. In FIG. 3D, the photo detectors 104 are aligned with the filters 122 of the diffraction grating 124 with a phase difference of 270 degrees.

In one example, the division 302 in FIG. 3 has the alignment with 0 degrees phase difference as shown in FIG. 3A, the division 304 in FIG. 3 has the alignment with 180 degrees phase difference as shown in FIG. 3C, the division 306 in FIG. 3 has the alignment with 270 degrees phase difference as shown in FIG. 3D, and the division 308 in FIG. 3 has the alignment with 90 degrees phase difference as shown in FIG. 3B. Any other phase arrangement is possible in various applications, including different number of phases (e.g., 8 phases instead of 4 phases) and different phase locations in the integrated circuit 300.

According to some embodiments, an integrated circuit includes a substrate, a plurality of photo detectors formed in the substrate, and a diffraction grating having multiple sections disposed over the plurality of photo detectors. Each section of the diffraction grating has a respective periodic width for a respective target wavelength. The diffraction grating has at least two different target wavelengths. The diffraction grating is interlaced with filters. The filters in each section of the diffraction grating are configured to pass a respective electromagnetic wave with the respective target wavelength.

According to some embodiments, a method includes forming a plurality of photo detectors in a substrate. A diffraction grating with multiple sections is formed over the photo detectors. Each section of the diffraction grating has a respective periodic width for a respective target wavelength. The diffraction grating has at least two different target wavelengths. The diffraction grating is interlaced with filters. The filters in each section of the diffraction grating are configured to pass a respective electromagnetic wave with the respective target wavelength.

According to some embodiments, an integrated circuit includes a substrate and a plurality of divisions of the substrate. Each division includes a plurality of photo detectors formed in the substrate and a diffraction grating having multiple sections disposed over the plurality of photo detectors. Each section of the diffraction grating has a respective periodic width for a respective target wavelength. The diffraction grating has at least two different target wavelengths. The diffraction grating is interlaced with filters. The filters in each section of the diffraction grating are configured to pass a respective electromagnetic wave with the respective target wavelength. The respective photo detectors in each division are aligned with the respective diffraction grating with a different phase from another division.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
a substrate;
a plurality of photo detectors formed in the substrate;
a protection layer formed over the substrate; and
a diffraction grating having multiple sections disposed over the plurality of photo detectors and physically contacting a first top surface of the protection layer, wherein a second top surface of the protection layer is farther from the substrate than a top surface of the diffraction grating,
wherein each section of the diffraction grating has a respective periodic width for a respective target wavelength, the diffraction grating has at least two different target wavelengths, the diffraction grating is interlaced with filters, and the filters in each section of the diffraction grating are configured to pass a respective electromagnetic wave with the respective target wavelength.

2. The integrated circuit of claim 1, wherein the plurality of photo detectors are located at a Talbot length away from the diffraction grating.

3. The integrated circuit of claim 2, wherein the periodic width, the target wavelength, and the Talbot length are related as expressed in the equation $$Z_T = \frac{2a^2}{\lambda}, \text{ or } Z_T = \frac{\lambda}{1 - \sqrt{1 - \frac{\lambda^2}{a^2}}},$$

wherein $a$ is the periodic width, $\lambda$ is the target wavelength, and $Z_T$ is the Talbot length.

4. The integrated circuit of claim 1, further comprising at least one dielectric layer between the plurality of photo detectors and the diffractive grating.

5. The integrated circuit of claim 4, wherein the at least one dielectric layer comprises $SiO_2$, SiN, or any combination thereof.

6. The integrated circuit of claim 1, wherein the plurality of photo detectors and the diffraction grating have the same periodic widths.

7. The integrated circuit of claim 6, wherein the plurality of photo detectors are aligned with the diffraction grating with a phase difference by 0 degrees, 90 degrees, 180 degrees, 270 degrees, or any combination thereof.

8. The integrated circuit of claim 1, wherein the diffraction grating comprises Cu, AlCu, SiN, or $SiO_2$.

9. The integrated circuit of claim 1, wherein the filters comprise photoresist or polymer.

10. The integrated circuit of claim 1, wherein the photo detectors are PN junction diodes.

11. An integrated circuit, comprising:
a substrate;
a plurality of divisions of the substrate, wherein each division includes:
a plurality of photo detectors formed in the substrate; and
a diffraction grating having multiple sections disposed over the plurality of photo detectors,
wherein each section of the diffraction grating has a respective periodic width for a respective target wavelength, the diffraction grating has at least two different target wavelengths, the diffraction grating is interlaced with filters, the filters in each section of the diffraction grating are configured to pass a respective electromagnetic wave with the respective target wavelength, and all of the respective plurality of photo detectors in each division are aligned with the respective diffraction grating with a first phase difference, the first phase difference being a different phase difference from a second phase difference of another division.

12. The integrated circuit of claim 11, wherein the diffraction grating comprises Cu, AlCu, SiN, or SiO$_2$.

13. The integrated circuit of claim 11, wherein the plurality of photo detectors and the diffraction grating have the same respective periodic widths.

14. The integrated circuit of claim 11, wherein the plurality of photo detectors are aligned with the diffraction grating with a first phase difference of 0 degrees, 90 degrees, 180 degrees, or 270 degrees.

15. The integrated circuit of claim 11, wherein the plurality of photo detectors are located at a Talbot length away from the diffraction grating.

16. The integrated circuit of claim 15, wherein the periodic width, the target wavelength, and the Talbot length are related as expressed in the equation $$Z_T = \frac{2a^2}{\lambda}, \text{ or } Z_T = \frac{\lambda}{1 - \sqrt{1 - \frac{\lambda^2}{a^2}}},$$

wherein $a$ is the periodic width, $\lambda$ is the target wavelength, and $Z_T$ is the Talbot length.

17. An integrated circuit, comprising:
a substrate;
a first dielectric layer and a first metal layer formed on a first major surface of the substrate;
a plurality of photo detectors formed in the substrate; and
a diffraction grating formed over a second major surface of the substrate, opposite the first major surface of the substrate, and over the plurality of photo detectors, the diffraction grating including:

a first section comprising metal lines spaced apart by a first pitch, with a first filter material configured to pass a first wavelength interjacent respective metal lines of the first section, wherein the metal lines of the first section have an exposed top surface;
a second section comprising metal lines spaced apart by a second pitch, the second pitch being different than the first pitch, with a second filter material configured to pass a second wavelength interjacent respective metal lines of the second section, wherein the metal lines of the second section have an exposed top surface; and
a third section comprising metal lines spaced apart by a third pitch, the third pitch being different than the first pitch and the second pitch, with a third filter material configured to pass a third wavelength interjacent respective metal lines of the third section, wherein the metal lines of the third section have an exposed top surface.

18. The integrated circuit of claim 17, wherein the plurality of photo detectors is aligned with the diffraction grating with no phase shift therebetween.

19. The integrated circuit of claim 17, further comprising:
a second plurality of photo detectors and a second diffraction grating; and
a third plurality of photo detectors and a third diffraction grating;
wherein the second plurality of photo detectors is aligned with the second diffraction grating with a phase shift therebetween, and the third plurality of photo detectors is aligned with the third diffraction grating with a different phase shift therebetween.

20. The integrated circuit of claim 17, wherein the diffraction grating comprises a metal and the first, second and third filter materials comprise a first, second and third polymer, respectively.

* * * * *